(12) United States Patent
Rajaee et al.

(10) Patent No.: US 9,455,737 B1
(45) Date of Patent: Sep. 27, 2016

(54) DELTA-SIGMA ANALOG-TO-DIGITAL CONVERTER (ADC) WITH TIME-INTERLEAVED (TI) OR TWO-STEP SUCCESSIVE APPROXIMATION REGISTER (SAR) QUANTIZER

(71) Applicant: QUALCOMM Incorporated, San Diego, CA (US)

(72) Inventors: Omid Rajaee, San Diego, CA (US); Changsok Han, Gainesville, FL (US); Liang Dai, San Diego, CA (US); Seyed Arash Mirhaj, Los Angeles, CA (US); Ganesh Kiran, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 15/049,933

(22) Filed: Feb. 22, 2016

Related U.S. Application Data

(60) Provisional application No. 62/232,611, filed on Sep. 25, 2015.

(51) Int. Cl.
*H03M 3/00* (2006.01)

(52) U.S. Cl.
CPC .............. *H03M 3/464* (2013.01); *H03M 3/38* (2013.01); *H03M 3/422* (2013.01); *H03M 3/496* (2013.01)

(58) Field of Classification Search
CPC ...... H03M 3/464; H03M 3/496; H03M 3/38; H03M 3/422
USPC ........................................ 341/143, 161–163
See application file for complete search history.

(56) References Cited

U.S. PATENT DOCUMENTS

| | | | |
|---|---|---|---|
| 5,103,229 A | 4/1992 | Ribner | |
| 8,344,921 B2 | 1/2013 | Lin et al. | |
| 8,947,285 B2 * | 2/2015 | Ceballos | H03M 3/418 341/118 |
| 8,963,754 B2 * | 2/2015 | Morgado | H03M 3/426 341/118 |
| 2015/0077280 A1 | 3/2015 | Park et al. | |

FOREIGN PATENT DOCUMENTS

| | | |
|---|---|---|
| CN | 103929184 A | 7/2014 |
| WO | WO-03084073 A1 | 10/2003 |

OTHER PUBLICATIONS

Chen Z., et al., "Noise Shaping Implementation inTwo-Step/SAR ADC Architectures Based on Delayed Quantazation Error," IEEE 54th International Midwest Symposium on Circuits and Systems (MWSCAS), 2011, pp. 1-4.

(Continued)

*Primary Examiner* — Khai M Nguyen
(74) *Attorney, Agent, or Firm* — Patterson & Sheridan, L.L.P.

(57) ABSTRACT

Certain aspects of the present disclosure provide a delta-sigma modulator (DSM) using time-interleaved (TI) successive approximation register (SAR) analog-to-digital converters (ADCs). For example, two SAR ADCs may be configured to alternately sample and process an input signal and provide a feedback signal for the DSM using excess loop delay (ELD). In other aspects, the DSM may be implemented using a two-step SAR quantizer. For example, a first SAR ADC may sample an input signal to generate a most-significant bit (MSB) portion of an output of the DSM, while the second SAR ADC may subsequently sample a residue from the first SAR ADC conversion and generate a least-significant bit (LSB) portion of the output of the DSM. With these techniques, higher bandwidths may be obtained in high accuracy delta-sigma ADCs without using increased sampling rates.

30 Claims, 15 Drawing Sheets

(56) References Cited

OTHER PUBLICATIONS

Cheng Y., et al., "Multibit Delta-Sigma Modulator with Two-Step Quantization and Segmented DAC", IEEE Transactions on Circuits and Systems-II : Express Briefs, vol. 53, No. 9, Sep. 2006, pp. 848-852.

Co-pending U.S. Appl. No. 14/475,852, filed Sep. 3, 2014.

* cited by examiner

US 9,455,737 B1

DELTA-SIGMA ANALOG-TO-DIGITAL CONVERTER (ADC) WITH TIME-INTERLEAVED (TI) OR TWO-STEP SUCCESSIVE APPROXIMATION REGISTER (SAR) QUANTIZER

CLAIM OF PRIORITY UNDER 35 U.S.C. §119

The present application claims the benefit of U.S. Provisional Application Ser. No. 62/232,611, entitled "DELTA-SIGMA ANALOG-TO-DIGITAL CONVERTER (ADC) WITH TIME-INTERLEAVED (TI) OR TWO-STEP SUCCESSIVE APPROXIMATION REGISTER (SAR) QUANTIZER" and filed Sep. 25, 2015, which is assigned to the assignee of the present application and is expressly incorporated by reference herein in its entirety.

TECHNICAL FIELD

Certain aspects of the present disclosure generally relate to analog-to-digital converters (ADCs) and, more particularly, to delta-sigma ADCs having quantizers implemented with successive approximation register (SAR) ADC circuits.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System—Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3rd Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

A mobile station or a base station may include one or more analog-to-digital converters (ADCs), for converting received, amplified, filtered, and downconverted analog signals to digital signals for additional processing in the digital domain, for example. Several types of ADCs are available, each with varying advantages and disadvantages. For example, a successive approximation register (SAR) ADC may provide an area and power-efficient architecture for low to medium accuracy analog-to-digital conversion applications. A SAR ADC may use a digital-to-analog converter (DAC) and a comparator to approximate a digital value corresponding to an analog input. Another type of ADC is referred to as a flash ADC, which may provide a faster conversion speed at the cost of an exponential increase in power and area consumption.

SUMMARY

Certain aspects of the present disclosure generally relate to a delta-sigma modulator having a quantizer with time-interleaved successive approximation register (SAR) analog-to-digital converter (ADC) circuits. Other aspects of the present disclosure generally relate to a delta-sigma modulator having a quantizer with two-step SAR ADC circuits.

Certain aspects of the present disclosure provide a delta-sigma modulator. The delta sigma modulator generally includes a loop having a node, a first SAR ADC selectively incorporated into the loop, and a second SAR ADC selectively incorporated into the loop, the first and second SAR ADCs being configured to alternately sample the node.

Certain aspects of the present disclosure provide a method of sampling an input signal. The method generally includes subtracting feedback of a loop in a delta-sigma modulator from the input signal to generate a difference signal, processing the difference signal in a portion of the loop to generate a processed signal, and alternately sampling the processed signal via a selective incorporation of a first SAR ADC and a second SAR ADC into the loop.

Certain aspects of the present disclosure provide an apparatus for sampling an input signal. The apparatus generally includes means for subtracting feedback of a loop in the apparatus from the input signal to generate a difference signal, means for processing the difference signal in a portion of the loop to generate a processed signal, and means for alternately sampling the processed signal via a selective incorporation of a first means for quantizing and a second means for quantizing into the loop.

Certain aspects of the present disclosure provide a delta-sigma modulator. The delta sigma modulator generally includes a loop having a node and a quantizer incorporated into the loop. The quantizer typically includes: (1) a first SAR ADC stage connected with the node and configured to convert a signal received from the node to a first digital signal; and (2) a second SAR ADC stage connected with an output of the first SAR ADC stage and configured to generate a second digital signal based on at least a portion of the first digital signal.

Certain aspects of the present disclosure provide a method of sampling an input signal. The method generally includes subtracting a feedback signal of a loop in a delta-sigma modulator from the input signal to generate a difference signal; processing the difference signal in a portion of the loop to generate a processed signal; sampling the processed signal with a quantizer to generate first and second digital signals, the sampling comprising converting at least a portion of the processed signal to the first digital signal via a first SAR ADC stage and generating the second digital signal based on at least a portion of the first digital signal via a second SAR ADC stage connected with an output of the first SAR ADC stage; and generating the feedback signal of the loop based on the first and second digital signals.

Certain aspects of the present disclosure provide an apparatus for sampling an input signal. The apparatus generally includes means for subtracting a feedback signal of a loop in the apparatus from the input signal to generate a difference signal; means for processing the difference signal in a portion of the loop to generate a processed signal; means for sampling the processed signal to generate first and second digital signals, wherein the means for sampling comprises a first means for quantizing at least a portion of the processed signal to the first digital signal and a second means for quantizing connected with an output of the first means for quantizing and configured to generate the second digital signal based on at least a portion of the first digital signal; and means for generating the feedback signal of the loop based on the first and second digital signals.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
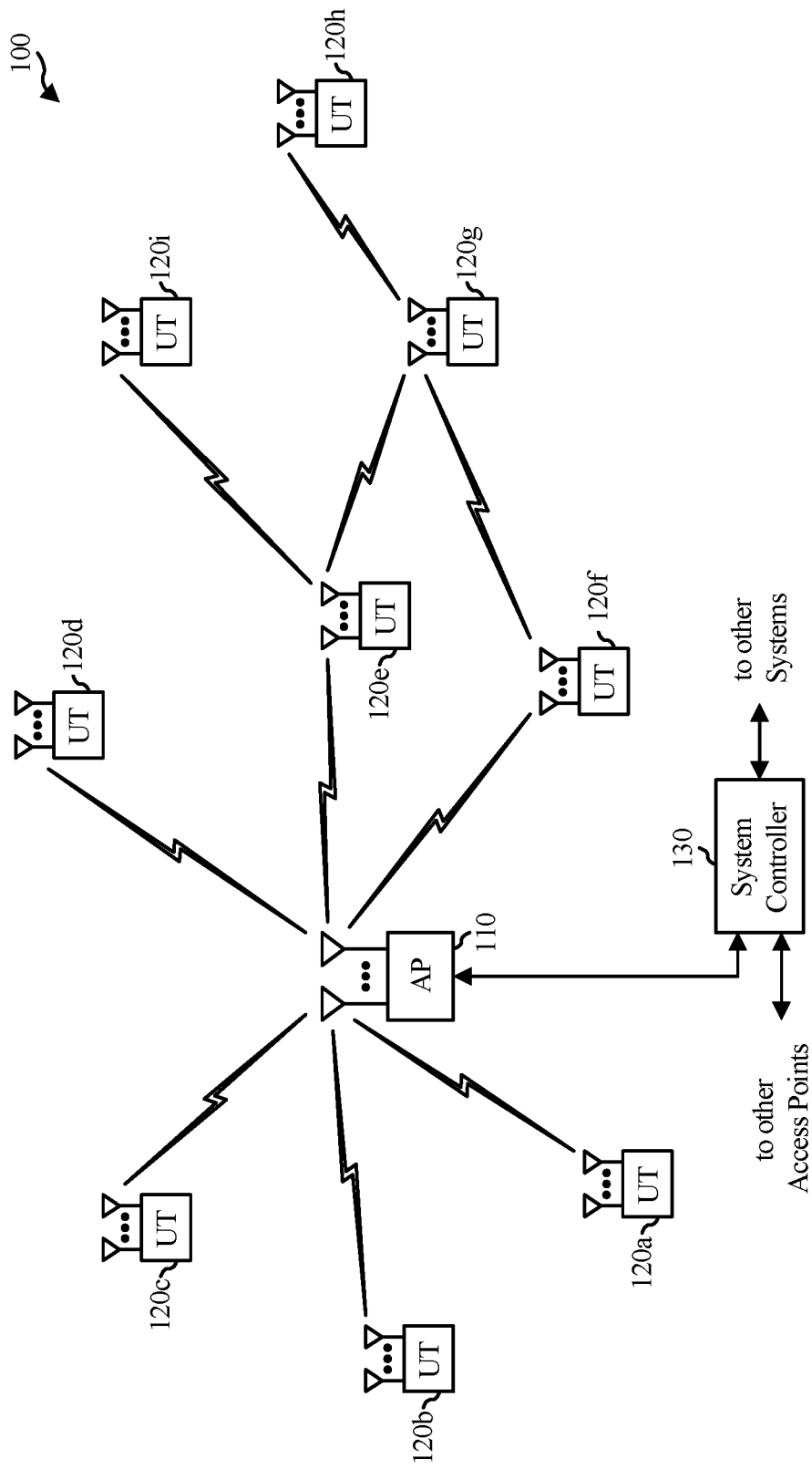
FIG. 1 is a diagram of an example wireless communications network, in accordance with certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

The access point 110 and/or user terminal 120 may include an analog-to-digital converter (ADC), which may be used, for example, to convert analog baseband signals to digital in-phase (I) or quadrature (Q) signals for digital signal processing. In certain aspects of the present disclosure, the ADC may be a delta-sigma modulator having a quantizer implemented with time-interleaved (TI) successive approximation register (SAR) ADC circuits or with two-step SAR ADC circuits.

Figure 2:
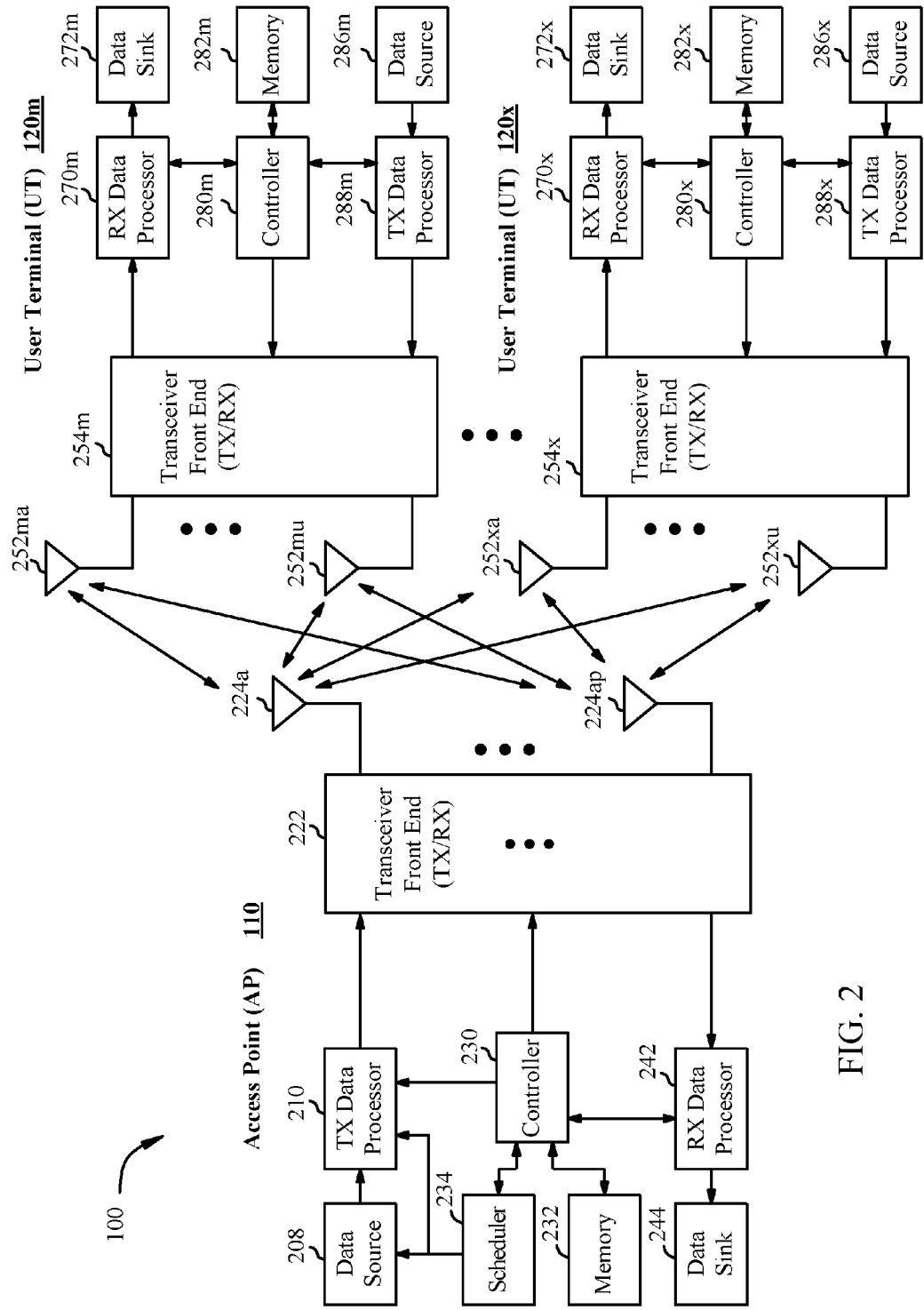
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front end (TX/RX) 222 of access point 110 and/or transceiver front end 254 of user terminal 120 may include an ADC, which may be used to convert baseband signals to digital I or Q signals for digital signal processing. In certain aspects of the present disclosure, the ADC may be a delta-sigma modulator having a quantizer implemented with time-interleaved (TI) successive approximation register (SAR) ADC circuits or with two-step SAR ADC circuits.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
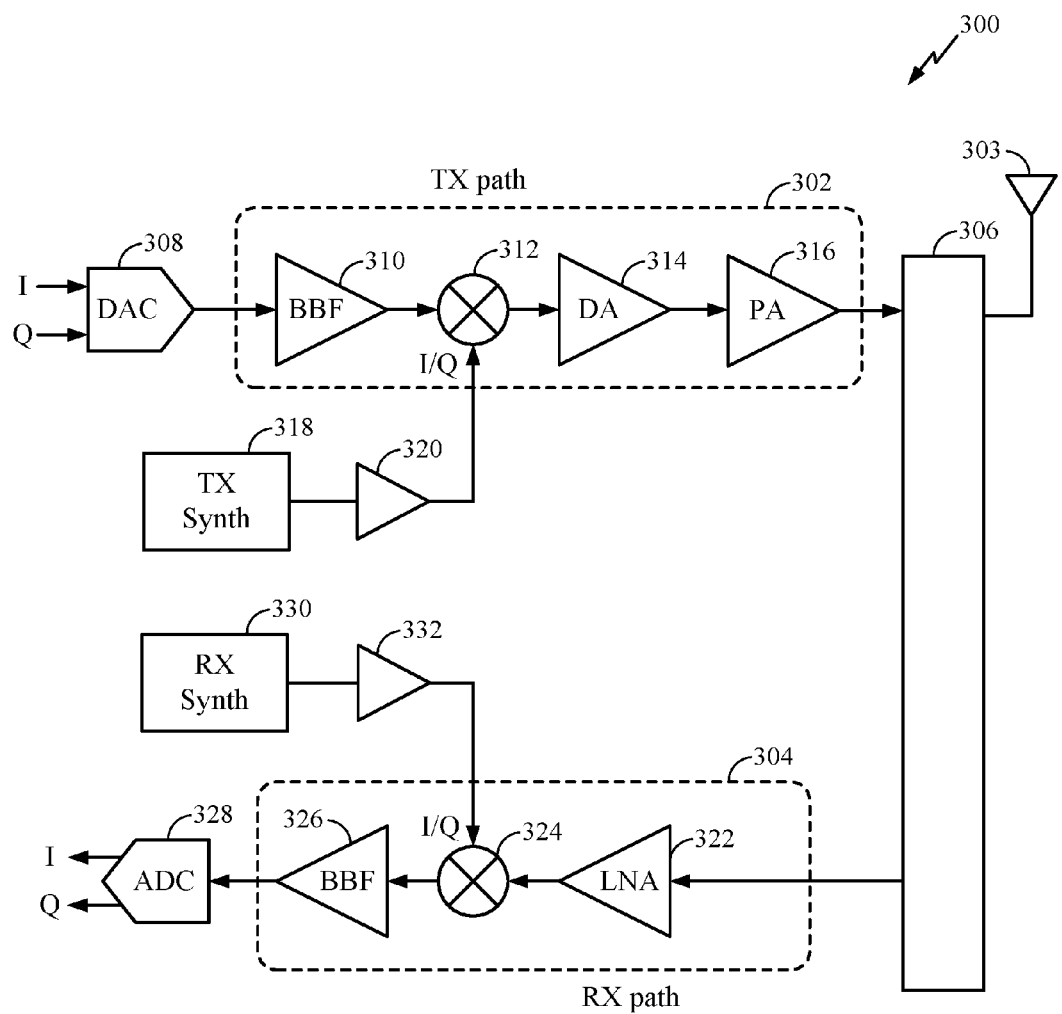
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 is often external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

In certain aspects of the present disclosure, the ADC 328 may be a delta-sigma modulator having a quantizer implemented with time-interleaved (TI) successive approximation register (SAR) ADC circuits or with two-step SAR ADC circuits.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

Example Delta-Sigma Modulator with Time-Interleaved SAR Quantizer

Advanced communication systems typically call for high bandwidth, high accuracy analog-to-digital converters (ADCs). High accuracy may be achieved by using delta-sigma ADCs, for example. However, the signal bandwidth of delta-sigma modulators is usually limited, and thus, delta-sigma modulators may be operated at a higher sampling rate in an effort to increase bandwidth and preserve high accuracy properties.

Delta-sigma ADCs may include at least one summer, at least one integrator, a quantizer for providing a digital output, and a digital-to-analog converter (DAC) for converting the digital output back to an analog signal as loop feedback to be subtracted from an input signal at the summer. Delta-sigma ADCs may be able to spare half a clock cycle for the quantizer of the ADC (and any data element matching (DEM) circuit). However, with increased sampling rates, half a clock cycle may not be enough for the quantizer to finish its operation.

Certain aspects of the present disclosure provide techniques and apparatus to incorporate a time-interleaved (TI) quantizer in the delta-sigma ADC loop.

In an effort to compensate for the delay of the quantizer in continuous time (CT) delta-sigma ADCs, excess loop delay (ELD) feedback may be utilized, which may stabilize the loop. In discrete time (DT) delta-sigma modulators (DSMs), the loop accommodates half a clock cycle for the operation of the quantizer. By using ELD feedback as illustrated in FIG. 4, the loop can tolerate a full clock cycle delay, as will be described in more detail below.

Figure 4:
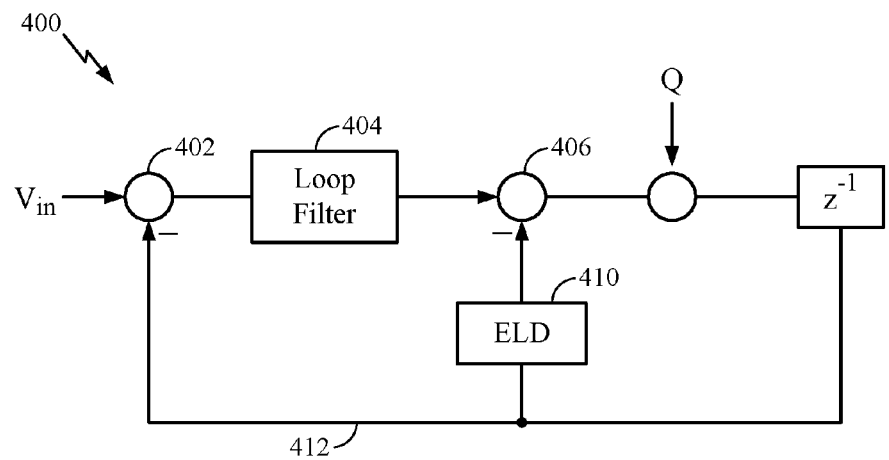
FIG. 4 is a block diagram of an example delta-sigma analog-to-digital converter (ADC) incorporating excess loop delay (ELD) feedback, in accordance with certain aspects of the present disclosure.

FIG. 4 is a block diagram of an example delta-sigma ADC 400 incorporating ELD feedback, in accordance with certain aspects of the present disclosure. The delta-sigma ADC 400 includes a summer 402, a loop filter 404, a summer 406, a quantizer (represented by "Q") for converting an analog signal to a digital signal, and an ELD circuit 410 (e.g., an ELD DAC). The summer 402 (e.g., implemented with an operational amplifier circuit) is used to subtract a feedback signal 412 from the input signal (Vin). Although not shown in the conceptual drawing of FIG. 4, there may be a DAC in the feedback loop connected with the summer 402. The loop filter 404 may include one or more integrators, filters, and/or scaling stages, as understood by a person skilled in the art. The output of the ELD circuit 410 is subtracted from the output of the loop filter 404 in the summer 406. By using the ELD circuit 410, the loop of the delta-sigma ADC 400 can tolerate a full clock cycle delay (e.g., $z^{-1}$ as shown).

A successive approximation register (SAR) ADC is a power-efficient quantizer for multi-bit delta-sigma modulation. However, SAR ADCs may use more time for conversion (e.g., as compared to flash ADCs). Adding ELD feedback as illustrated in FIG. 4 allows extra time for conversion for a SAR-implemented quantizer and enables the quantizer to resolve more bits. According to certain aspects of the present disclosure, time-interleaved (TI) SAR ADCs may be used in an effort to keep the effective sampling rate of the output of summer 406 unchanged. For example, two TI SAR ADCs may alternately sample the output of summer 406 such that each SAR ADC has a full clock cycle to converge, as will be described in more detail with respect to FIG. 5. Potentially, the quantizer with TI SAR ADCs can resolve twice as many bits compared to a conventional approach, without reducing the effective sampling rate.

Figure 5:
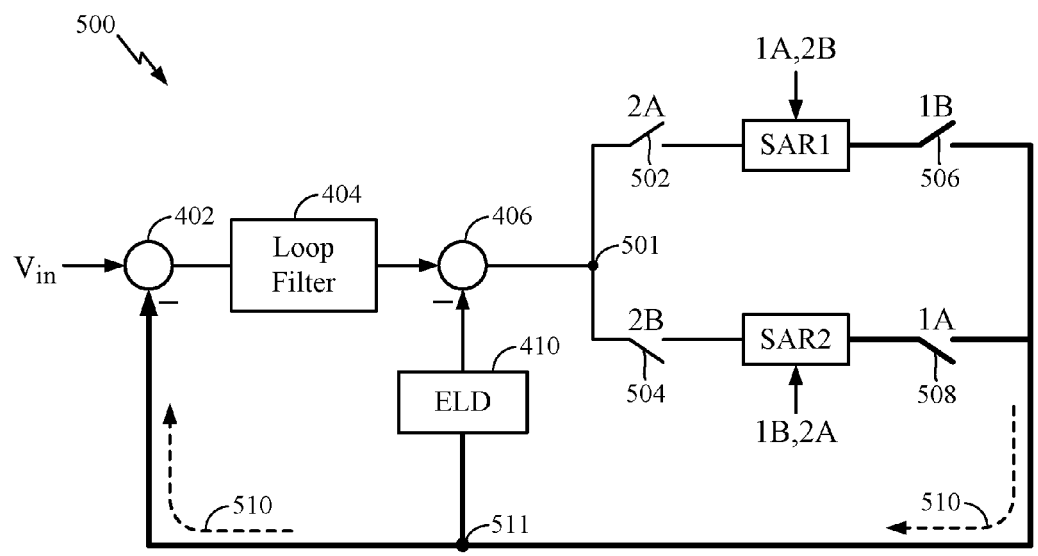
FIG. 5 is a block diagram of an example delta-sigma ADC incorporating ELD feedback with time-interleaved (TI) successive approximation register (SAR) ADCs, in accordance with certain aspects of the present disclosure.

FIG. 5 is a block diagram of an example delta-sigma ADC 500 incorporating ELD feedback with TI SAR ADCs, in accordance with certain aspects of the present disclosure. As illustrated, a signal output from the summer 406 (e.g., a differential amplifier providing a signal representing a difference between the output of the loop filter 404 and the ELD circuit 410) at node 501 may be sent to a first SAR ADC (labeled "SAR1") and a second SAR ADC (labeled "SAR2") (e.g., the TI SAR ADCs) through respective switches 502, 504. The digital output of each of SAR1 and SAR2 may be fed back into the loop 510 at node 511 (e.g., to summer 402 and/or summer 406) through another set of respective switches 506, 508.

Figure 6:
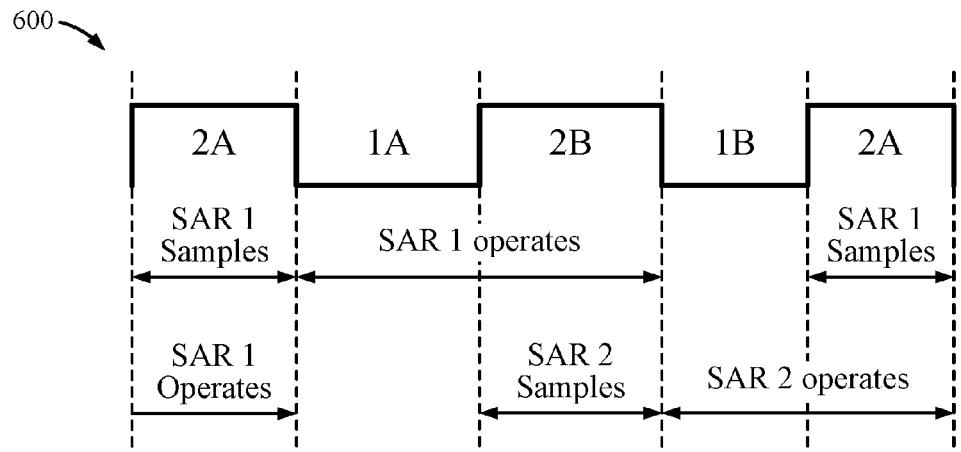
FIG. 6 is an example timing diagram for the TI SAR ADCs of FIG. 5, according to certain aspects of the present disclosure.

FIG. 6 is an example timing diagram 600 corresponding to the operations of the TI SAR ADCs of FIG. 5, according to certain aspects of the present disclosure. The timing diagram 600 is described in conjunction with FIGS. 7A-7D, which illustrate the TI SAR ADCs of the delta-sigma ADC 500 during different phases of operation.

Figure 7A:
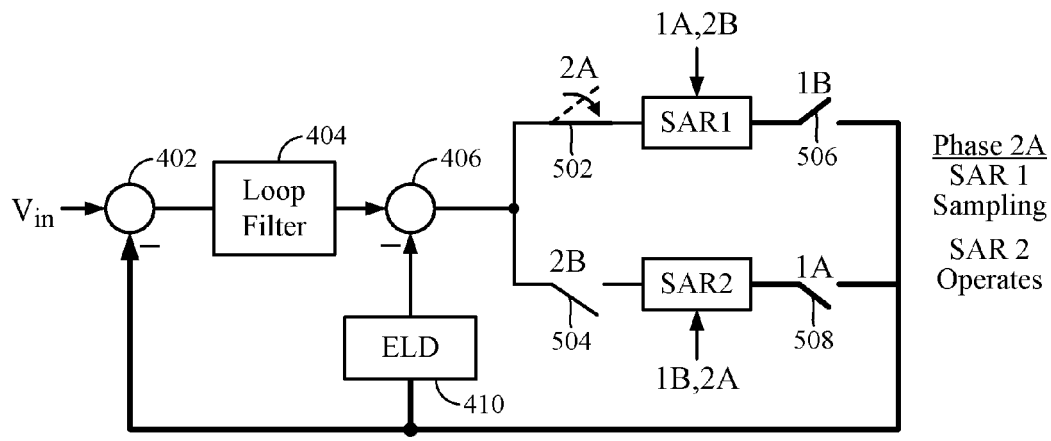
FIGS. 7A-7D illustrate different phases of operation for the TI SAR ADCs of FIG. 5, in accordance with certain aspects of the present disclosure.

As illustrated in FIG. 7A, during phase 2A of the timing diagram 600, switch 502 may be closed, and SAR1 may sample a signal output from the summer 406. During phase 2A, switch 504 may be open, and SAR2 may be processing a previously sampled signal (e.g., converting the previously sampled analog signal to a digital signal). Switches 506 and 508 may also be open during phase 2A.

Figure 7B:
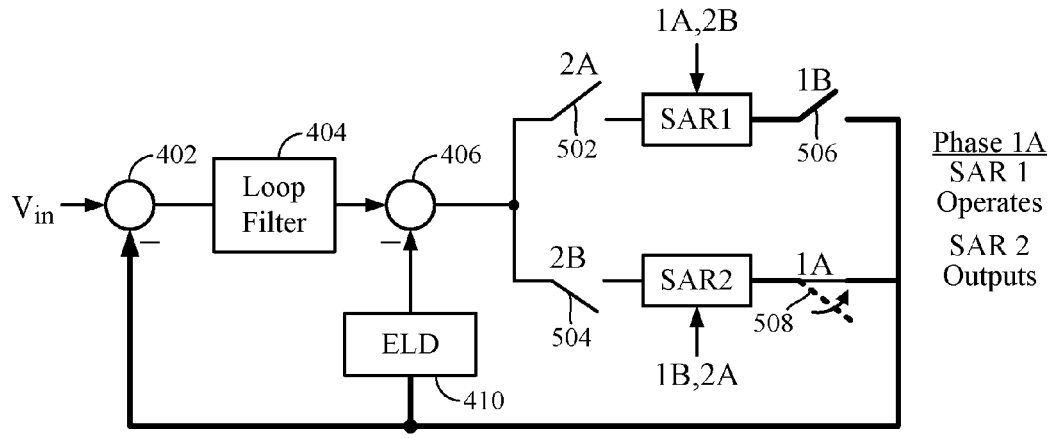

Phase 1A may follow phase 2A as shown in the timing diagram 600 of FIG. 6. During phase 1A as illustrated in FIG. 7B, switch 502 may be open (thereby terminating the sampling of phase 2A), and SAR1 may process the signal that was sampled during phase 2A (e.g., converting the previously sampled analog signal to a digital signal). Also during phase 1A, switch 508 may be closed in order for SAR2 to output the processed signal resultant from the operations during phase 2A (and the preceding phase 1B, as explained below). Switches 504 and 506 may also be open during phase 1A.

Figure 7C:
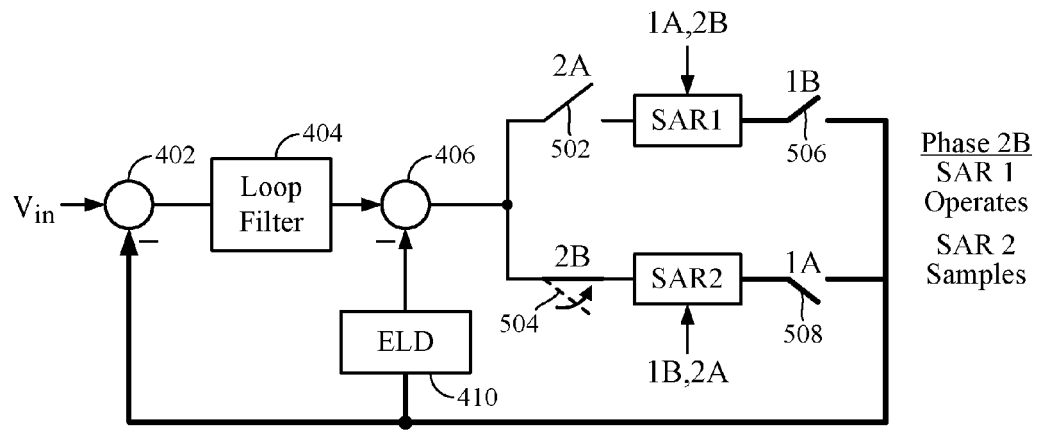

Phase 2B may follow phase 1A as shown in the timing diagram 600 of FIG. 6. During phase 2B as illustrated in FIG. 7C, switch 504 may be closed allowing for SAR2 to obtain a new sample, by sampling the signal output from the summer 406. In parallel, SAR1 continues to process the signal sampled during phase 2A, and switch 502 may remain open. Switches 506 and 508 may also be open during phase 2B.

Figure 7D:
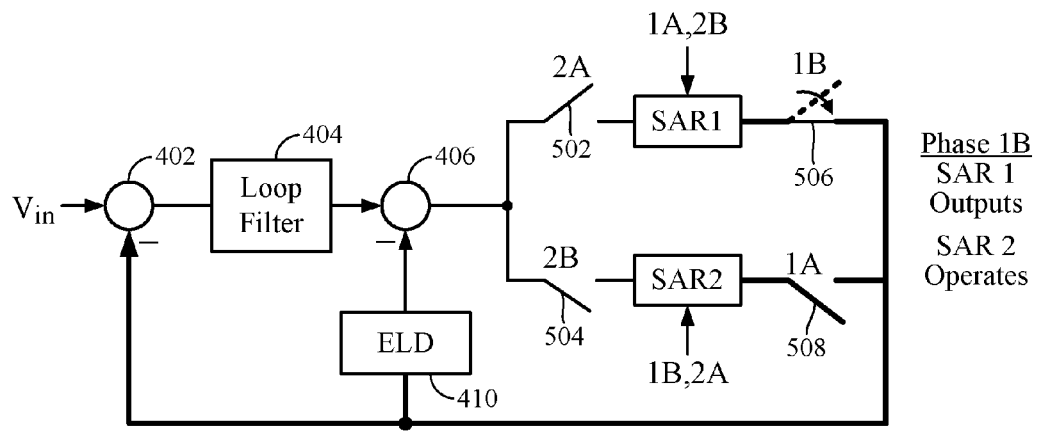

Phase 1B may follow phase 2B as shown in the timing diagram 600 of FIG. 6. During phase 1B as illustrated in FIG. 7D, switch 506 may be closed such that the processed signal of SAR1 may be output from the quantizer and fed back in the loop 510. Also during phase 1B, switch 504 may be open (thereby terminating the sampling of phase 2B), and SAR2 may process the signal sampled during phase 2B (e.g., converting the previously sampled analog signal to a digital signal).

As illustrated by the timing diagram 600, each of SAR1 and SAR2 may process a previously sampled signal for a full clock cycle (i.e., one period of the square wave) and may sample a following signal output by the summer 406 for half of a clock cycle. For example, during phases 1A and 2B, SAR1 may process a signal sampled during phase 2A. During phase 2B, while SAR1 is processing the signal sampled during phase 2A, SAR2 may sample the signal during phase 2B, which may be processed by SAR2 during phases 1B and 2A. After phase 1B, the TI SAR ADCs may enter phase 2A as illustrated in FIG. 6, and the operations illustrated in FIGS. 7A-7D may repeat.

Figure 8A:
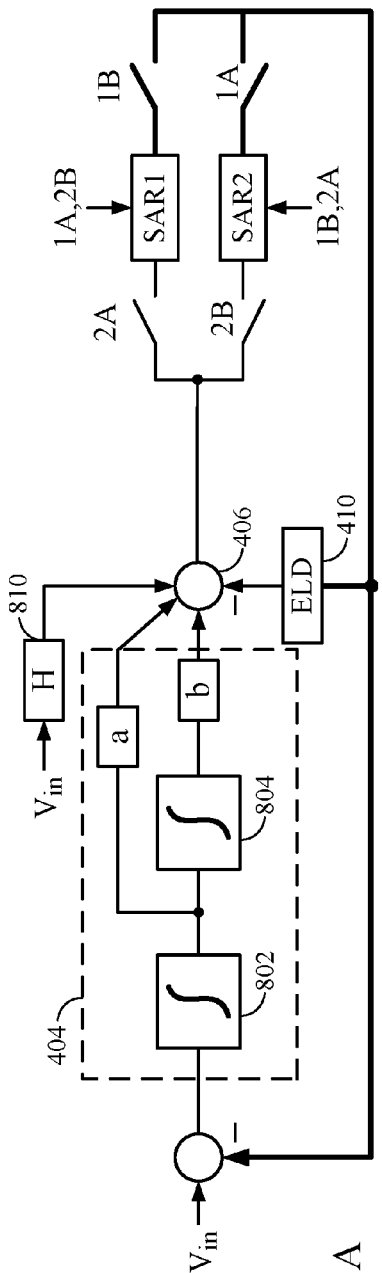
FIG. 8A is a block diagram of an example general system-level implementation of a second-order delta-sigma modulator with TI SAR ADCs, in accordance with certain aspects of the present disclosure.

FIG. 8A is a block diagram of an example general system-level implementation of a second-order delta-sigma modulator (DSM) with TI SAR ADCs and a feedforward input, in accordance with certain aspects of the present disclosure. As illustrated, the loop filter 404 includes two integrators 802, 804, where an output of integrator 802 is scaled by scaling coefficient a and the output of integrator 804 is scaled by scaling coefficient b, which are described in more detail with respect to FIG. 8B. Inputs to the summer 406 may include the scaled output of integrator 802, the scaled output of integrator 804, the ELD feedback as described above, and the input signal (Vin) processed by a transfer function (H) (e.g., a filter 810) as part of the feedforward implementation of the second-order DSM. The output of the summer 406 is sent to the TI SAR ADCs.

Figure 8B:
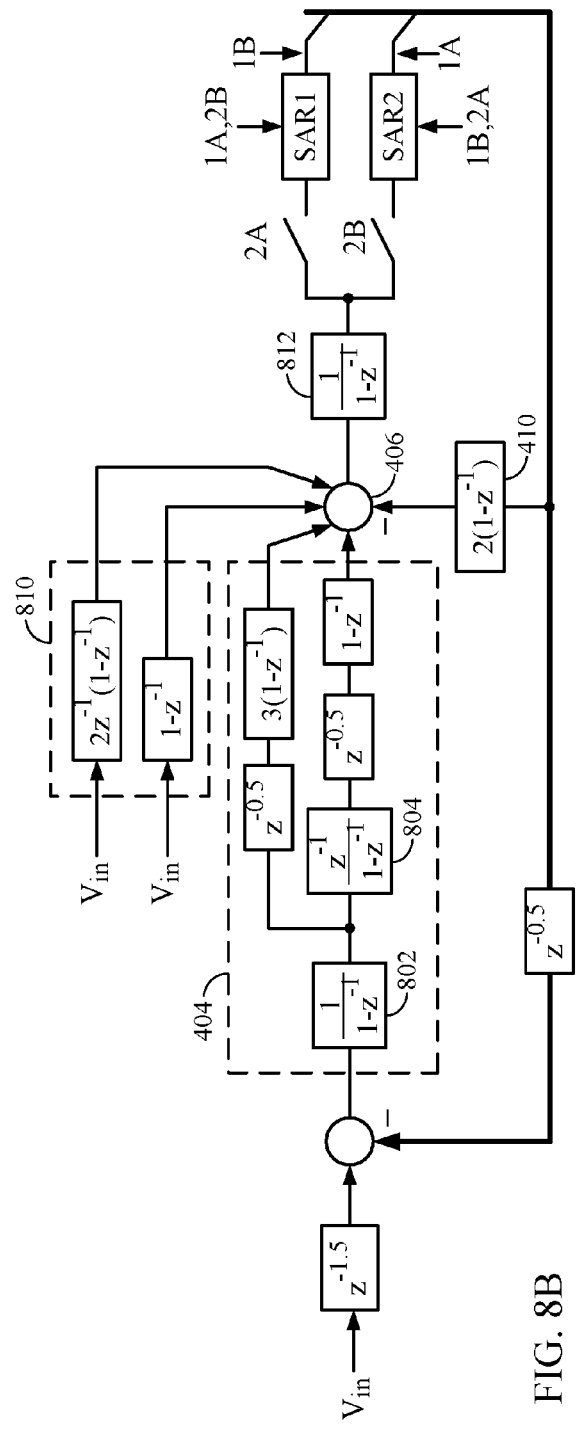
FIG. 8B illustrates example Z-transforms for the second-order delta-sigma modulator of FIG. 8A, in accordance with certain aspects of the present disclosure.

FIG. 8B illustrates example Z-transforms for the second-order delta-sigma modulator of FIG. 8A, in accordance with certain aspects of the present disclosure. Z-transforms convert a discrete-time signal into a complex frequency domain representation. For example, the ELD circuit 410 may be represented by the z-transform $2(1-z^{-1})$ as shown. In certain aspects, the output of the summer 406 may be sent to the TI SAR ADCs via a delay-free integrator 812, which may be configured as a differentiator $(1-z^{-1})$ in the feedforward paths added at the input of the integrator 812.

The ELD feedback may provide a delay-free path around the summer 406 and quantizer. Therefore, the ELD feedback path may not have enough time to transfer all the quantization noise for one of the SAR ADCs to the summer 406 for the next operation of the other SAR ADC. One possible solution is to break the feedback path into separate feedback paths for most significant bits (MSBs) and least significant bits (LSBs) of the digital outputs of the TI SAR ADCs, as will be described in more detail with respect to FIGS. 9A and 9B.

Figures 9A, 9B:
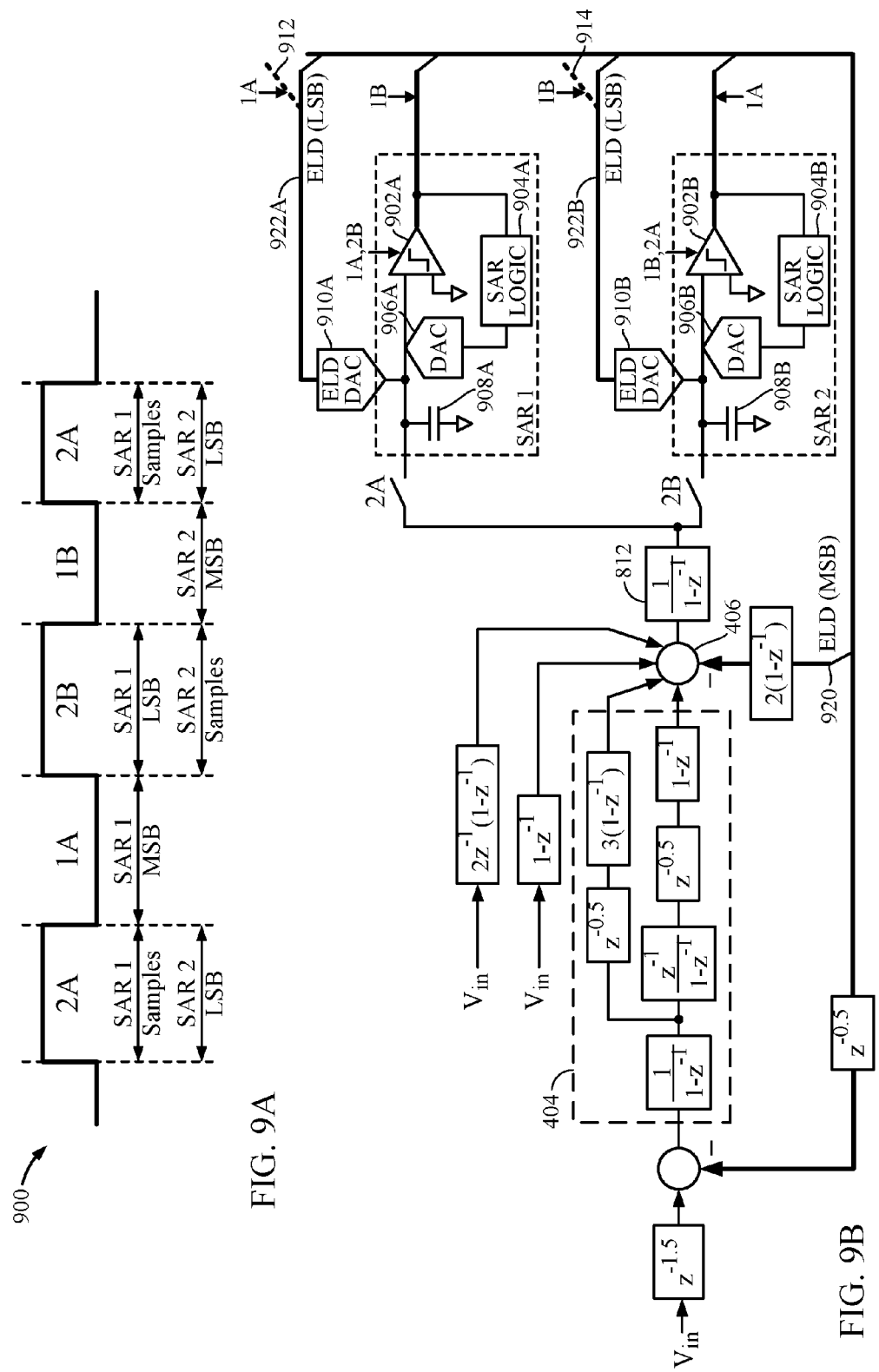
FIG. 9A is an example timing diagram for the TI SAR ADCs of FIG. 9B, in accordance with certain aspects of the present disclosure.
FIG. 9B illustrates the example Z-transforms of FIG. 8B, modified with a separate feedback path for most significant bits (MSBs) and another for least significant bits (LSBs) of digital outputs of the TI SAR ADCs, in accordance with certain aspects of the present disclosure.

FIG. 9A is an example timing diagram 900 corresponding to the operations of the TI SAR ADCs (SAR1 and SAR2) in FIG. 9B, in accordance with certain aspects of the present disclosure. FIG. 9B illustrates the example Z-transforms of FIG. 8B, modified with MSB and LSB feedback paths, in accordance with certain aspects of the present disclosure. As illustrated, SAR1 processes an input (sampled during phase 2A) via the comparator 902A, SAR logic 904A, and digital-to-analog converter (DAC) 906A. The processed MSB(s) of the SAR1 stage (e.g., processed during phase 1A) may be available half a clock cycle earlier than the LSB(s) (e.g., processed during phase 2B), as illustrated in the timing diagram 900 of FIG. 9A. Thus, the MSB data can be fed to summer 406 by using an ELD feedback path 920 (e.g., implemented with an ELD DAC). The LSB(s) (e.g., processed during phase 2B) of SAR1 may later be applied to the SAR2 capacitor array (represented by capacitor 908B of SAR2) at the beginning of a following SAR2 operation using switch 914 and ELD path 922B, during phase 1B. For example, the LSB(s) processed by SAR1 during phase 2B may be fed to the capacitor array using an ELD DAC 910B during a subsequent phase 1B.

Similarly, SAR2 processes a signal (sampled during phase 2B) using comparator 902B, SAR logic 904B, and DAC 906B. The MSB(s) of the SAR2 stage processed during phase 1B (e.g., of the signal sampled during phase 2B) may be fed back using the same ELD feedback path 920. The LSB(s) processed during phase 2A by SAR2 may be fed back and applied to the SAR1 capacitor array (represented by capacitor 908A of SAR1) during a subsequent phase 1A (not shown in the timing diagram 900 of FIG. 9A) via switch 912, ELD path 922A, and ELD DAC 910A, for a following operation by SAR1.

In some cases, offset difference between the TI SAR ADCs as described above can increase the swing of the integrator(s) and, thus, it may be desirable to manage this offset difference. For example, if the (voltage) offsets of SAR1 and SAR2 are different, a signal component may be created at $f_s/2$, where $f_s$ is the sampling frequency. A signal component at $f_s/2$ may be amplified by a high-pass noise transfer function and may appear at the outputs of the integrators 802, 804. This can potentially saturate components in the delta-sigma modulator, such as operational transconductance amplifiers (OTAs).

Figure 10:
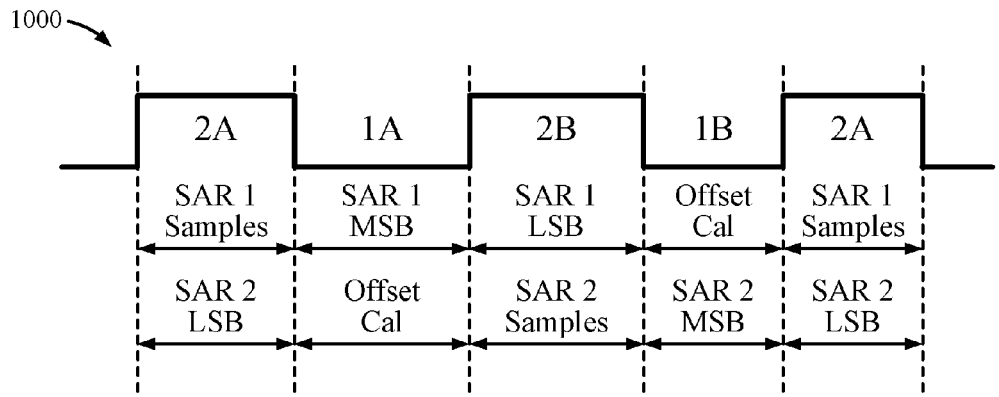
FIG. 10 is an example timing diagram for TI SAR ADCs indicating an offset calibration phase for each SAR ADC, in accordance with certain aspects of the present disclosure.

FIG. 10 is an example timing diagram 1000 of TI SAR ADCs indicating an offset calibration phase for each SAR ADC, in accordance with certain aspects of the present disclosure. As illustrated in the timing diagram 1000, SAR1 may be idle during phase 1B, and SAR2 may be idle during phase 1A. Thus, phases 1B and 1A may be used for real-time calibration of offset in the SAR ADC. For certain aspects, offset calibration during these phases may involve using a coarse offset calibration circuit and a fine calibration circuit, as shown in FIGS. 11A and 11B and described below.

Figure 11A:
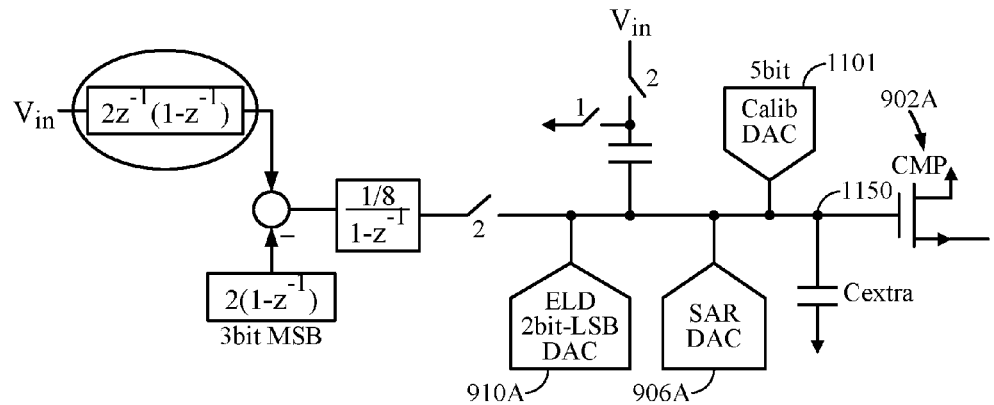
FIG. 11A illustrates an example coarse offset calibration circuit for comparators of the TI SAR ADCs, in accordance with certain aspects of the present disclosure.

FIG. 11A illustrates an example coarse offset calibration circuit for a comparator of one of the TI SAR ADCs, in accordance with certain aspects of the present disclosure. Initially, a coarse offset calibration may be performed by using a calibration DAC 1101 at the input of at least one of SAR1 or SAR2 in an effort to limit the offset to a fraction of an LSB. For example, the calibration DAC 1101 may be a 5-bit DAC, which may receive a digital signal corresponding to a desired adjustment to the offset and output an analog signal based on the desired offset adjustment to the input of comparator 902A at node 1150. A similar calibration circuit may be used to adjust an offset of comparator 902B of SAR2.

Figure 11B:
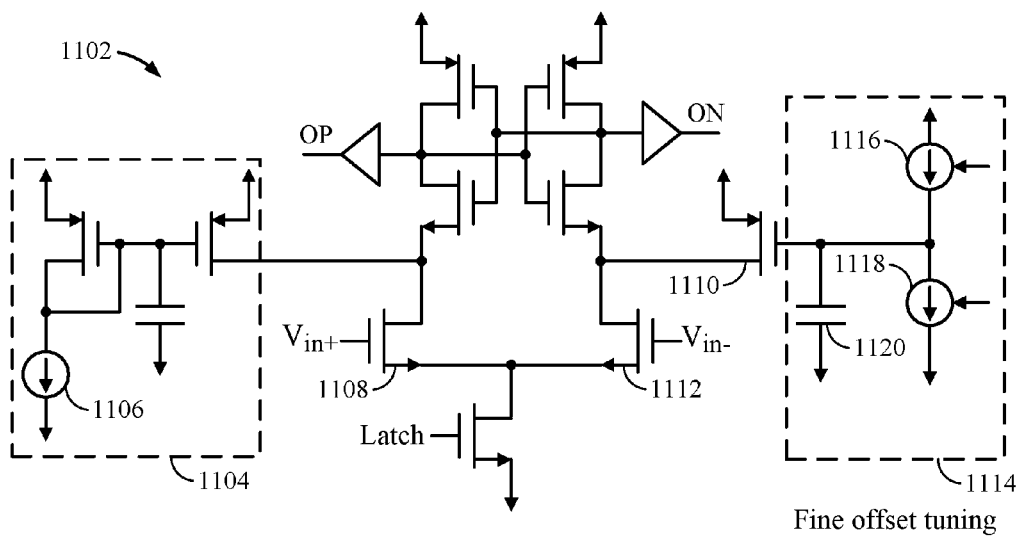
FIG. 11B illustrates an example fine offset calibration circuit for comparators of the TI SAR ADCs, in accordance with certain aspects of the present disclosure.

FIG. 11B illustrates an example fine offset calibration circuit for a comparator of one of the TI SAR ADCs, in accordance with certain aspects of the present disclosure. Once a coarse calibration of the offset has been achieved using the calibration DAC 1101 of FIG. 11A, for example, minor tweaking of current flowing in differential legs of the comparator can compensate, or at least adjust, for any remaining offset. As illustrated, the comparator 1102 may include a current mirror 1104 configured to mirror a current of a current source 1106, based on which a current flows through a transistor 1108 of a differential leg (e.g., corresponding to a positive voltage potential $V_{in+}$) of the comparator. A transistor 1110 coupled to another differential leg (e.g., corresponding to a negative voltage potential $V_{in-}$) of the comparator 1102 may be used to adjust the current flow through transistor 1112. In certain aspects, a voltage regulation circuit 1114 may be coupled to a gate of a transistor 1110 and can be used for fine offset adjustment. For example, the voltage regulation circuit 1114 may include a charge pump circuit having a current source 1116 and a current source 1118. Current sources 1116 and 1118 may provide respective charging and discharging currents to a capacitor 1120 to regulate a voltage at the gate of transistor 1110. By regulating the gate voltage of transistor 1110, the current flow through the negative differential leg of the comparator 1102 may be adjusted to fine tune the offset voltage of the comparator 1102. This technique may reduce the standard deviation ($\sigma$) of the comparator offset variation to below 100 µV, for example.

Figure 12:
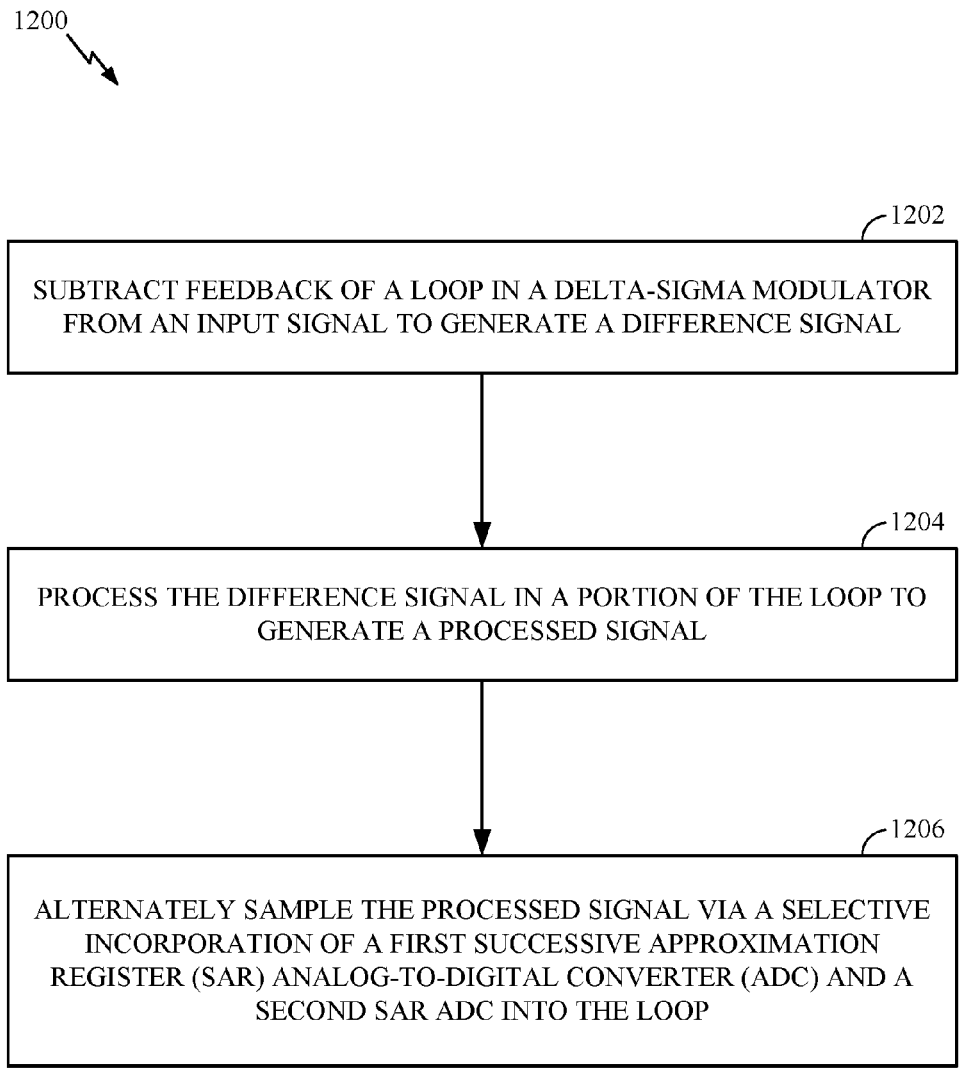
FIG. 12 is a flow diagram of example operations for sampling an input signal using a delta-sigma modulator with a time-interleaved SAR quantizer, in accordance with certain aspects of the present disclosure.

FIG. 12 is a flow diagram of example operations 1200 for sampling an input signal using a delta-sigma modulator with a time-interleaved SAR quantizer, in accordance with certain aspects of the present disclosure. The operations 1200 may be performed by various components in a delta-sigma modulator, such as the delta-sigma ADCs of FIGS. 5, 8A, and 9B.

The operations 1200 may begin, at block 1202, by subtracting feedback of a loop (e.g., loop 510) in the delta-sigma modulator from the input signal to generate a difference signal. At block 1204, one or more components (e.g., one or more integrators) of the delta-sigma modulator process (e.g., integrate, filter, sum, and/or scale) the difference signal in a portion of the loop to generate a processed signal. At block 1206, a quantizer of the delta-sigma modulator may alternately sample the processed signal via a selective incorporation of a first SAR ADC (e.g., SAR1) and a second SAR ADC (e.g., SAR2) into the loop. As used herein, "selective incorporation" of an ADC into a loop of a delta-sigma modulator generally refers to purposefully connecting (or disconnecting) the ADC such that the ADC is included in (or excluded from) the loop. An ADC can sample a signal in the loop of the delta-sigma modulator while the ADC is included in the loop.

In certain aspects, each of the first and second SAR ADCs has a full clock cycle of the delta-sigma modulator for conversion.

In certain aspects, the processing at block 1204 involves generating an excess loop delay (ELD) signal based alternately on an output of the first SAR ADC and an output of the second SAR ADC and subtracting the ELD signal from a loop signal in the loop to generate the processed signal.

In certain aspects, alternately sampling the processed signal at block 1206 entails closing a first switch (e.g., switch 502) to sample the processed signal with the first SAR ADC during a first phase (e.g., phase 2A) and closing a second switch (e.g., 504) to sample the processed signal with the second SAR ADC during a second phase (e.g., phase 2B). In this case, alternately sampling the processed signal may further include: closing a third switch (e.g., switch 508) to connect an output of the second SAR ADC with the loop during a third phase (e.g., phase 1A); and closing a fourth switch (e.g., switch 506) to connect an output of the first SAR ADC with the loop during a fourth phase (e.g., phase 1B). Closing the first, second, third, and/or fourth switches during different phases is an example of selectively incorporating the first and second SAR ADCs. The first SAR ADC may convert the sampled signal to a digital signal during the third and second phases, and the second SAR ADC may convert the sampled signal to a digital signal during the fourth and first phases. In certain aspects, the third phase begins after the first phase begins and before the second phase begins, and the fourth phase begins after the second phase begins.

In certain aspects, the operations 1200 further involve calibrating an offset of the first SAR ADC during the fourth phase and calibrating an offset of the second SAR ADC during the third phase.

In certain aspects, the operations 1200 further include: (1) closing a fifth switch (e.g., switch 914) during the fourth phase to connect the output of the first SAR ADC with an input of a first excess loop delay (ELD) digital-to-analog converter (DAC) (e.g., ELD DAC 910B), wherein an output of the first ELD DAC is connected with an input of the second SAR ADC; and (2) closing a sixth switch (e.g., switch 912) during the third phase to connect the output of the second SAR ADC with an input of a second ELD DAC (ELD DAC 910A), wherein an output of the second ELD DAC is connected with an input of the first SAR ADC.

In certain aspects, the operations 1200 further include alternately converting a digital signal output by the first SAR ADC and a digital signal output by the second SAR ADC to generate the feedback of the loop.

Example Delta-Sigma Modulator with Two-Step SAR Quantizer

As described above, advanced communication systems may employ high bandwidth and high accuracy ADCs. High accuracy may be attained by using delta-sigma ADCs, for example, but the signal bandwidth of delta-sigma ADCs may be limited. Therefore, delta-sigma modulators may be operated at higher sampling rates, or the oversampling ratio (OSR) may be reduced, in an effort to increase bandwidth and preserve high accuracy properties. Certain aspects presented herein with respect to FIGS. 4-12 address the high bandwidth challenge of delta-sigma ADCs by using time-interleaved SAR ADCs with ELD feedback. Other aspects of the present disclosure described below address this high bandwidth challenge using a different technique, namely a two-step SAR quantizer in an effort to increase the resolution of the quantizer without having to more quickly operate the quantizer. Such a two-step SAR quantizer may allow for a reduction in the overall quantization noise power and in the OSR to increase the bandwidth of the delta-sigma ADC.

Conventional delta-sigma ADCs may spare a half clock cycle for quantization of an input signal. A two-step pipeline quantizer may also use a half clock cycle for two full conversions and can be used as a quantizer for delta-sigma ADCs. This allows for an increase in the effective number of quantization levels and relatively reduces the quantization noise of the delta-sigma ADC. Hence, a lower OSR can be used, and increased signal bandwidth may be achieved. However, a two-step pipeline ADC may use two flash quantizers, which consume a significant amount of power and occupy significant area. Moreover, up to a half clock cycle may be used for data element matching (DEM) for each of the flash quantizers, which reduces the amount of time that can be used for integration and may not permit simplification of the loop filter by using a feedforward implementation. Therefore, higher power and area penalties may be imposed on the loop filter of the delta-sigma ADC when using a two-step pipelined quantizer with flash quantizers.

Figure 13:
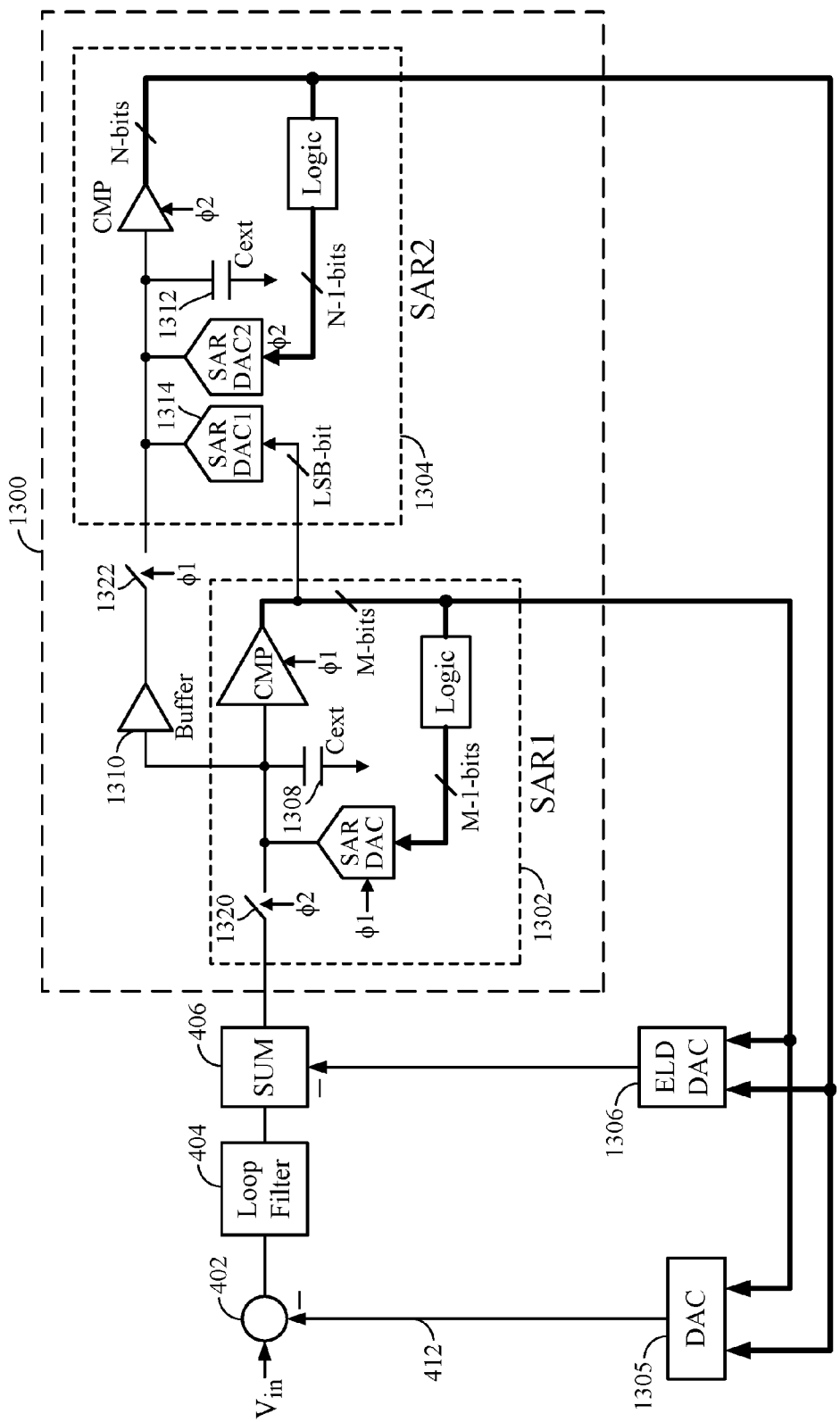
FIG. 13 is a block diagram of an example delta-sigma ADC with a two-step SAR quantizer having a buffer for amplifying a partial residue of an initial SAR ADC, in accordance with certain aspects of the present disclosure.

FIG. 13 is a block diagram of an example delta-sigma ADC with a two-step SAR quantizer 1300, in accordance with certain aspects of the present disclosure. As illustrated, the two-step SAR quantizer 1300 may include a first SAR ADC circuit 1302 (labeled "SAR1") and a second SAR ADC circuit 1304 (labeled "SAR2"), rather than flash quantizers. However, the two-step SAR quantizer may use half a clock cycle more time to finish operation (e.g., conversion convergence) as compared to flash quantizers. However, the extra half clock cycle may be provided by using excess loop delay (ELD) feedback in the delta-sigma modulator via an ELD DAC 1306, for example. Aspects of the present disclosure may not use a separate multiplying DAC (MDAC) for residue generation. That is, a capacitor array (represented by capacitor 1308) may carry a partial residue of SAR1 of the two-step SAR quantizer.

For example, during a sampling phase of SAR1 (e.g., during phase Φ2), switch 1320 may close such that SAR1 samples an output of summer 406 with the capacitor array. During a subsequent processing phase (e.g., during phase Φ1), switch 1320 may be opened, and SAR1 may process the sampled signal. M bits representing the signal processed by SAR1 may be fed back via DAC 1305 and/or ELD DAC 1306. At this stage, the capacitor array (represented by capacitor 1308) may carry the partial residue as a result of the processing by SAR1, which may be amplified, buffered, or attenuated via an amplifier (implemented as a buffer 1310 in FIG. 13) and sampled by SAR2 (e.g., by closing switch 1322 connected with the output of buffer 1310 during phase Φ1) with another capacitor array (represented by capacitor 1312). The partial residue from SAR1 may be processed by SAR2 during a following processing phase (e.g., during phase Φ2). N bits at the output of SAR2 representing the processed partial residue received from SAR1 may be fed back to DAC 1305 and/or ELD DAC 1306. Moreover, the LSB of the output of SAR1 may be deducted from the capacitor array of SAR2 via a SAR DAC 1314, for example, just before beginning operations of SAR2.

Figure 14:
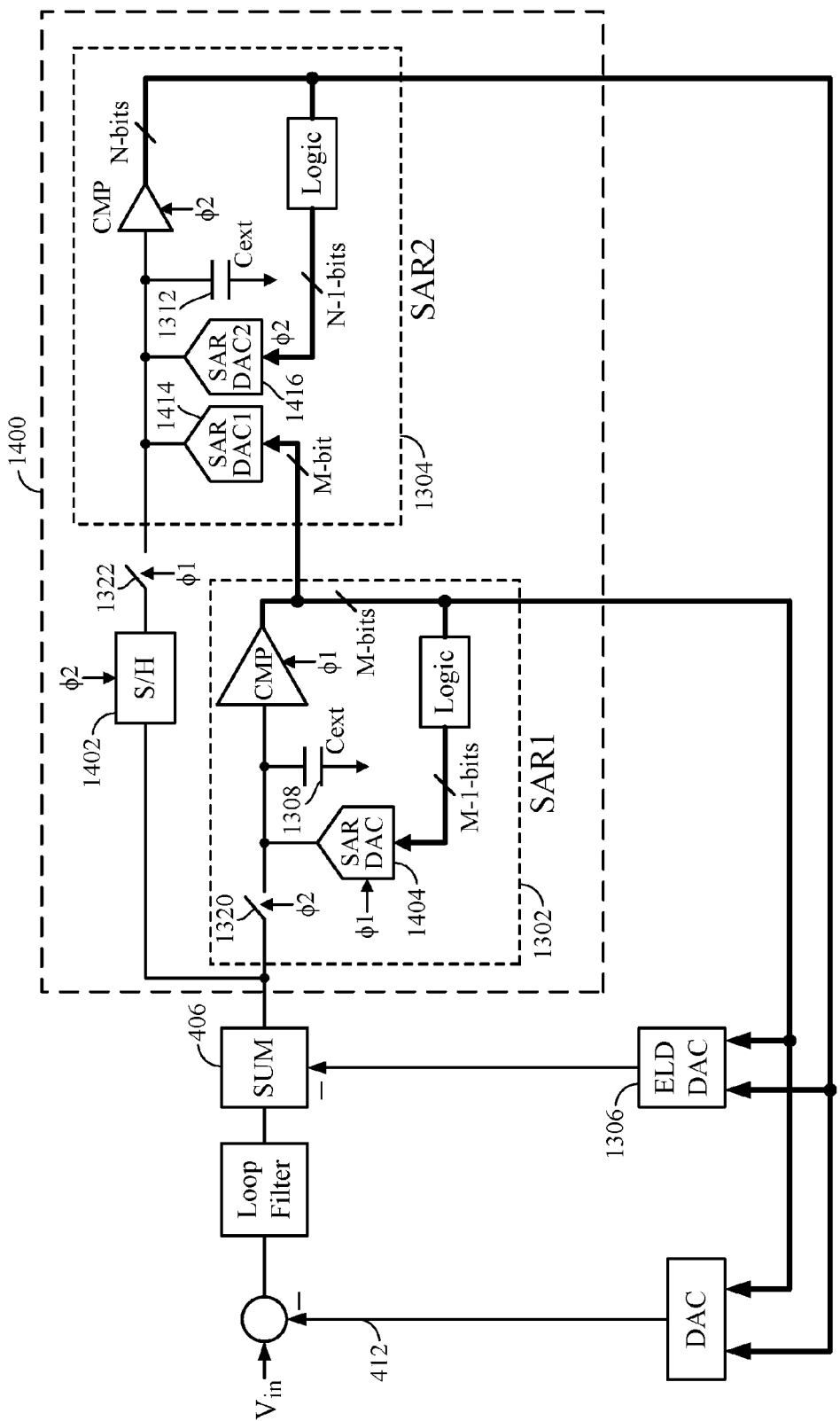
FIG. 14 is a block diagram of an example delta-sigma ADC with a two-step SAR quantizer implemented with a sample-and-hold (S/H) circuit, in accordance with certain aspects of the present disclosure.

In FIG. 13, the buffer 1310 used for buffering the residue may have a relatively short time (e.g., a fraction of a clock cycle) to operate. FIG. 14 is a block diagram of an example delta-sigma ADC with a two-step SAR quantizer 1400 implemented with a sample-and-hold (S/H) circuit 1402 instead of the buffer 1310, in accordance with certain aspects of the present disclosure. The S/H circuit 1402 is configured to sample and hold the output of the summer 406 for operation of the second SAR ADC circuit 1304. For certain aspects, the residue generation MDAC of SAR1 may be embedded within the capacitor array of SAR2.

During a sampling phase of SAR1 (e.g., during phase Φ2), switch 1320 may be closed such that SAR1 samples the output of summer 406. In parallel (e.g., also during phase Φ2), the S/H circuit 1402 may also sample and hold the output of summer 406. During a subsequent phase (e.g., during phase Φ1), switch 1320 may be opened, SAR1 may process the previously sampled signal, and switch 1322 may be closed such that SAR2 samples the signal held by the S/H circuit 1402. During another subsequent phase (e.g., during phase Φ2), SAR2 may process the sampled signal, and SAR1 and the S/H circuit may sample another signal output by summer 406. In certain aspects, a SAR DAC 1414 of SAR2 may receive an M-bit output of SAR1 processed during a previous processing phase of SAR1. The output of SAR DAC 1414 may be used to deduct the residue of SAR1 from the capacitor array of SAR2.

In certain aspects, the inter-stage gain of the two-step ADC can be implemented in the S/H circuit 1402 for the input signal to the two-step SAR quantizer 1400. In this case, the DAC path may be adjusted for by changing the capacitance ratio between SAR DAC 1414 and SAR DAC 1416 of SAR2. In other aspects, the inter-stage gain of one of SAR1 or SAR2 may be used. In this case, the relative reference of SAR2 may be scaled accordingly.

Figure 15:
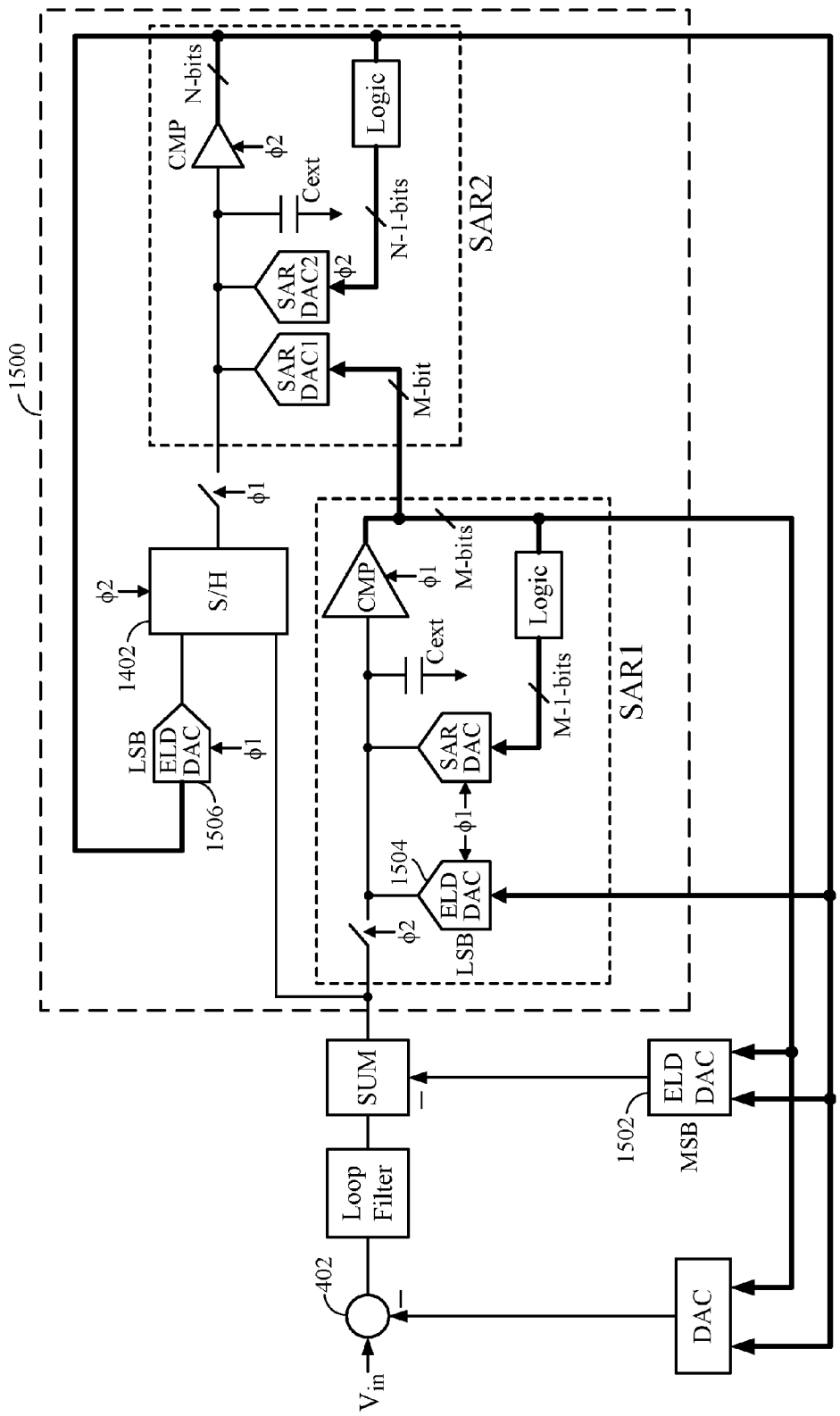
FIG. 15 is a block diagram of an example delta-sigma ADC with a two-step SAR quantizer implemented with a segmented ELD digital-to-analog converter (DAC), in accordance with certain aspects of the present disclosure.

One-bit redundancy may be employed between SAR1 and SAR2 in an effort to prevent SAR2 from saturating due to offset and other non-idealities of SAR1. FIG. 15 is a block diagram of an example delta-sigma ADC with a two-step SAR quantizer 1500 implemented with a segmented ELD DAC, in accordance with certain aspects of the present disclosure. As illustrated, the ELD DAC 1306 of FIG. 14 is effectively divided into two segments: an MSB segment for MSBs provided by SAR1 and an LSB segment for LSBs provided by SAR2. The LSB portion may have little time to settle if fed back to the input of summer 406 using ELD feedback (e.g., via ELD DAC 1306). Thus, the MSB segment may be implemented via an ELD DAC 1502 for feeding back the MSBs output by SAR1 to the input of summer 406, whereas, the LSB segment may be implemented by feeding the output of SAR2 back to the inputs of SAR1 and the S/H circuit 1402. That is, the LSB portion generated by SAR2 may be fed back to an input of SAR1 using ELD DAC 1504 and also fed back to an input of the S/H circuit 1402 via ELD DAC 1506 as illustrated in FIG. 15.

Figure 16:
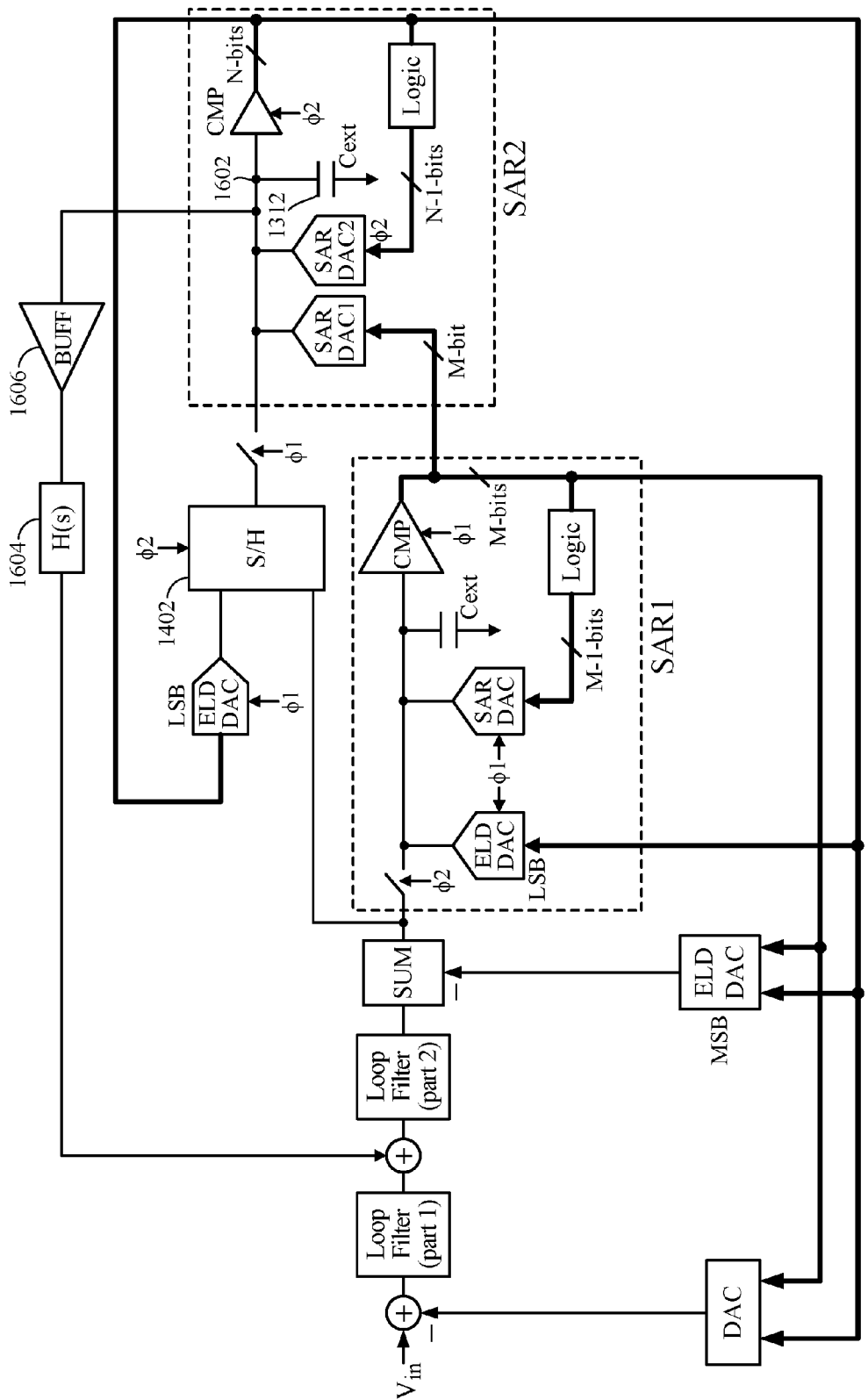
FIG. 16 is a block diagram of an example delta-sigma ADC having a two-step SAR quantizer with a residue of a final SAR ADC fed back to an internal node of a loop filter of the ADC, in accordance with certain aspects of the present disclosure.

FIG. 16 is a block diagram of an example delta-sigma ADC having a two-step SAR quantizer where a residue of a SAR2 is fed back to an internal node of a loop filter of the ADC, in accordance with certain aspects of the present disclosure. As illustrated, the residue of SAR2 may be available in analog form at a node 1602 connected with the capacitor array (represented by capacitor 1312) at the end of conversion (e.g., after a processing phase for SAR2, Φ2). This analog residue at node 1602 may be buffered, amplified, or attenuated by an amplifier (configured as a buffer 1606 in FIG. 16) and fed back to one or more internal nodes of the loop filter after applying a transfer function H(s) (e.g., implemented by a filter 1604) in an effort to increase the order of noise shaping. Feeding back this residue to internal nodes of the loop filter in this manner may offer aggressive noise shaping in addition to aggressive quantization and may prove useful for very low OSR (e.g., OSR <8) applications.

Two-step SAR quantizers described herein may result in lower power consumption and area. Delta-sigma modulators (DSMs) with two-step SAR quantizers described herein may accommodate a half-clock-cycle extra delay by means of an ELD DAC (e.g., ELD DAC 1306). DSMs with two-step SAR quantizers described herein can be configured with a low distortion feedforward loop, which can save additional power and area. Moreover, the two-step SAR quantizer as described herein can provide quantization residue, which can be used to enhance noise shaping of the DSM loop. This allows for a significant increase in noise shaping order without changing the loop filter.

Figure 17:
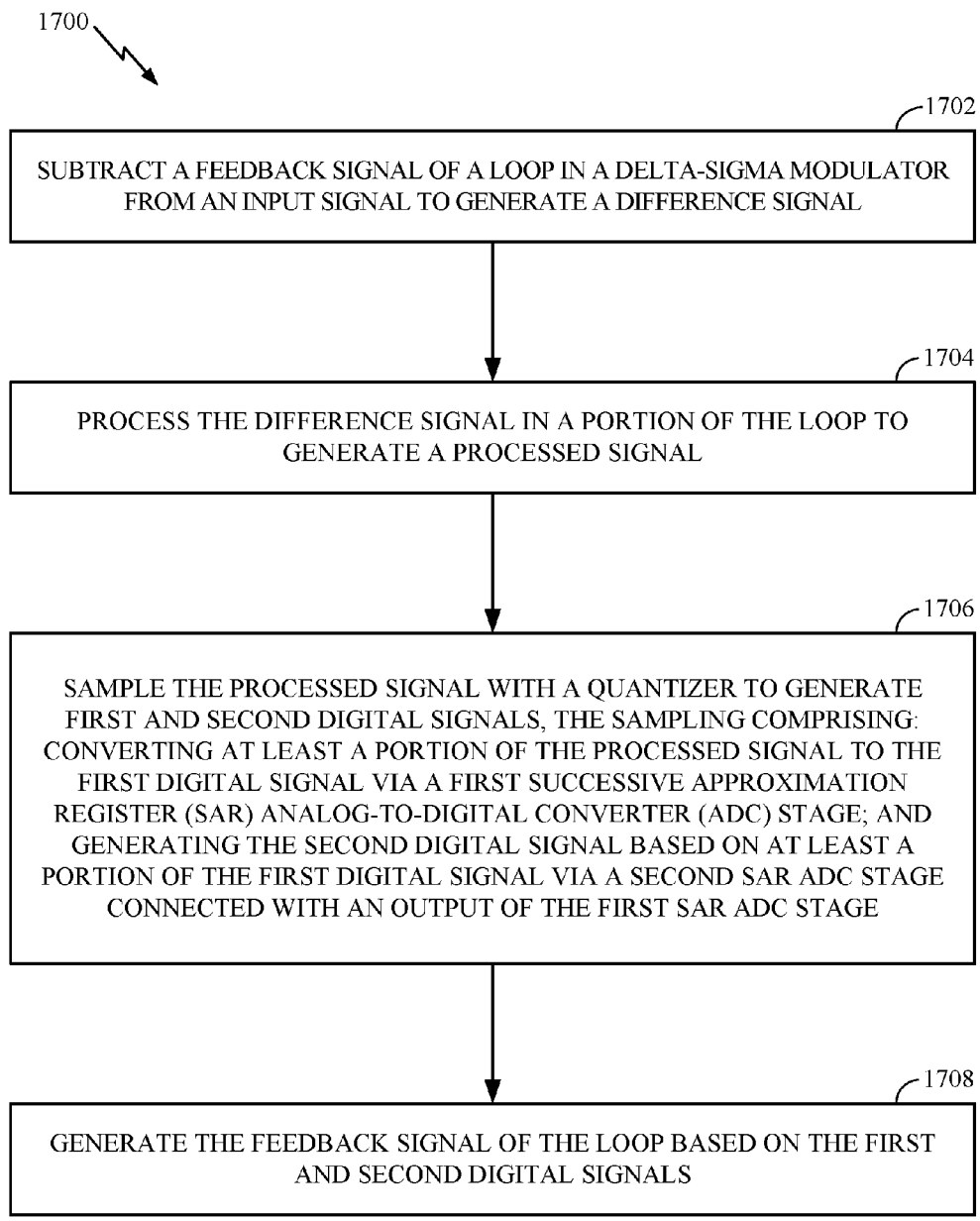
FIG. 17 is a flow diagram of example operations for sampling an input signal using a delta-sigma modulator with a two-step SAR quantizer, in accordance with certain aspects of the present disclosure.

FIG. 17 is a flow diagram of example operations 1700 for sampling an input signal using a delta-sigma modulator with a two-step SAR quantizer, in accordance with certain aspects of the present disclosure. The operations 1700 may be performed by a various components in a delta-sigma modulator, such as the delta-sigma ADCs of FIGS. 13-16.

The operations 1700 may begin, at block 1702, by subtracting a feedback signal of a loop (e.g., loop 510) in the delta-sigma modulator from the input signal to generate a difference signal. At block 1704, one or more components (e.g., a loop filter) of the delta-sigma modulator processes (e.g., integrates, filters, sums, and/or scales) the difference signal in a portion of the loop to generate a processed signal. At block 1706, a quantizer in the delta-sigma modulator samples the processed signal to generate first and second digital signals. The quantizer sampling generally includes: (1) converting at least a portion of the processed signal to the first digital signal via a first SAR ADC stage (e.g., first SAR ADC circuit 1302); and (2) generating the second digital signal based on at least a portion (e.g., M bits or the LSB) of the first digital signal via a second SAR ADC stage (e.g., second SAR ADC circuit 1304) connected with an output of the first SAR ADC stage. At block 1708, a circuit (e.g., DAC 1305) generates the feedback signal (e.g., feedback signal 412) of the loop based on the first and second digital signals.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front end 300 depicted in FIG. 3). Means for receiving may comprise a receiver (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front end 300 depicted in FIG. 3). Means for processing, means for determining, means for closing, and/or means for opening may comprise a processing system, which may include one or more processors (e.g., the TX data processor 210, the RX data processor 242, and/or the controller 230 of the access point 110 shown in FIG. 2, or the RX data processor 270, the TX data processor 288, and/or the controller 280 of the user terminal 120 illustrated in FIG. 2).

Furthermore, means for subtracting (or means for adding/summing) may comprise a summing circuit (e.g., the summer 402 and/or the summer 406 illustrated in FIGS. 5, 8A, 8B, and 9B). Means for processing a signal (e.g., a difference signal) may comprise any of various suitable circuits (e.g., the loop filter 404 illustrated in FIGS. 5 and 8A, including the integrators 802, 804 shown in FIG. 8A). Means for alternately sampling a signal may comprise a time-interleaved quantizer, which may be composed of switches (e.g., switches 502, 504, 506, and 508 in FIGS. 5 and 7A-7D) and multiple means for quantizing. Means for quantizing may include an ADC (e.g., a SAR ADC circuit, such as SAR1 or SAR2, as illustrated in FIGS. 5, 8A, 8B, 9B, and 13-16). Means for sampling a signal may comprise a quantizer (e.g., a two-step SAR quantizer as shown in FIGS. 13-16). Means for generating a signal may comprise a digital-to-analog converter (e.g., DAC 1305 as depicted in FIG. 13). Means for calibrating may comprise a circuit, such as the coarse calibration circuit depicted in FIG. 11A and/or the fine calibration circuit portrayed in FIG. 11B.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:
1. A delta-sigma modulator comprising:
a loop having a node;
a first successive approximation register (SAR) analog-to-digital converter (ADC) selectively incorporated into the loop; and
a second SAR ADC selectively incorporated into the loop, the first and second SAR ADCs being configured to alternately sample the node.

2. The delta-sigma modulator of claim 1, wherein each of the first and second SAR ADCs has a full clock cycle of the delta-sigma modulator for conversion.

3. The delta-sigma modulator of claim 1, further comprising:
a summer; and
an excess loop delay (ELD) circuit, wherein an output of the summer is connected with the node, wherein a first input of the summer is incorporated into the loop, and wherein a second input of the summer is connected with an output of the ELD circuit.

4. The delta-sigma modulator of claim 3, wherein an input of the ELD circuit is coupled to another node of the loop, the other node being selectively connected with an output of the first SAR ADC or an output of the second SAR ADC.

5. The delta-sigma modulator of claim 4, further comprising:
a first switch configured to selectively connect an input of the first SAR ADC with the node during a first phase; and
a second switch configured to selectively connect an input of the second SAR ADC with the node during a second phase.

6. The delta-sigma modulator of claim 5, further comprising:
a third switch configured to selectively connect the output of the second SAR ADC with the other node during a third phase; and
a fourth switch configured to selectively connect the output of the first SAR ADC with the other node during a fourth phase.

7. The delta-sigma modulator of claim 6, wherein the third phase begins after the first phase begins and before the second phase begins and wherein the fourth phase begins after the second phase begins.

8. The delta-sigma modulator of claim 6, wherein the first SAR ADC comprises a calibration circuit configured to calibrate an offset of the first SAR ADC during the fourth phase and wherein the second SAR ADC comprises a calibration circuit configured to calibrate an offset of the second SAR ADC during the third phase.

9. The delta-sigma modulator of claim 6, further comprising:
a first ELD digital-to-analog converter (DAC) having an input selectively connected with the output of the first SAR ADC via a fifth switch and an output connected with the input of the second SAR ADC, wherein the fifth switch is closed during the fourth phase; and
a second ELD DAC having an input selectively connected with the output of the second SAR ADC via a sixth switch and an output connected with the input of the first SAR ADC, wherein the sixth switch is closed during the third phase.

10. A method of sampling an input signal, comprising:
subtracting feedback of a loop in a delta-sigma modulator from the input signal to generate a difference signal;
processing the difference signal in a portion of the loop to generate a processed signal; and
alternately sampling the processed signal via a selective incorporation of a first successive approximation register (SAR) analog-to-digital converter (ADC) and a second SAR ADC into the loop.

11. The method of claim 10, wherein each of the first and second SAR ADCs has a full clock cycle of the delta-sigma modulator to converge.

12. The method of claim 10, wherein the processing comprises:
generating an excess loop delay (ELD) signal based alternately on an output of the first SAR ADC and an output of the second SAR ADC; and
subtracting the ELD signal from a loop signal in the loop to generate the processed signal.

13. The method of claim 10, wherein alternately sampling the processed signal comprises:
closing a first switch to sample the processed signal with the first SAR ADC during a first phase; and
closing a second switch to sample the processed signal with the second SAR ADC during a second phase.

14. The method of claim 13, wherein alternately sampling the processed signal further comprises:
closing a third switch to connect an output of the second SAR ADC with the loop during a third phase; and
closing a fourth switch to connect an output of the first SAR ADC with the loop during a fourth phase, wherein the first SAR ADC converts the sampled signal to a digital signal during the third and second phases and wherein the second SAR ADC converts the sampled signal to a digital signal during the fourth and first phases.

15. The method of claim 14, wherein the third phase begins after the first phase begins and before the second phase begins and wherein the fourth phase begins after the second phase begins.

16. The method of claim 14, further comprising:
calibrating an offset of the first SAR ADC during the fourth phase; and
calibrating an offset of the second SAR ADC during the third phase.

17. The method of claim 14, further comprising:
closing a fifth switch during the fourth phase to connect the output of the first SAR ADC with an input of a first ELD digital-to-analog converter (DAC), wherein an output of the first ELD DAC is connected with an input of the second SAR ADC; and
closing a sixth switch during the third phase to connect the output of the second SAR ADC with an input of a second ELD DAC, wherein an output of the second ELD DAC is connected with an input of the first SAR ADC.

18. A delta-sigma modulator comprising:
a loop having a node; and
a quantizer incorporated into the loop, comprising:
a first successive approximation register (SAR) analog-to-digital converter (ADC) stage connected with the node and configured to convert a signal received from the node to a first digital signal; and
a second SAR ADC stage connected with an output of the first SAR ADC stage and configured to generate a second digital signal based on at least a portion of the first digital signal.

19. The delta-sigma modulator of claim 18, further comprising:
a digital-to-analog converter (DAC) incorporated into the loop and connected with the output of the first SAR ADC stage and an output of the second SAR ADC stage, wherein the DAC is configured to convert the first and second digital signals to a feedback signal for the delta-sigma modulator; and
a summer configured to receive an input signal for the delta-sigma modulator and subtract the feedback signal from the input signal to generate a difference signal, wherein the difference signal is input into the loop for processing.

20. The delta-sigma modulator of claim 18, further comprising:
 a summer; and
 an excess loop delay (ELD) digital-to-analog converter (DAC) configured to generate an analog signal based on the first and second digital signals, wherein:
  an output of the summer is connected with the node;
  a first input of the summer is incorporated into the loop;
  a second input of the summer is connected with an output of the ELD DAC; and
  the ELD DAC is connected with the output of the first SAR ADC stage and an output of the second SAR ADC stage.

21. The delta-sigma modulator of claim 18, wherein the second SAR ADC stage comprises:
 a comparator;
 at least one capacitor connected with an input of the comparator and selectively connected with an input of the second SAR ADC stage; and
 a digital-to-analog converter (DAC) having an input connected with the output of the first SAR ADC stage and an output connected with the input of the comparator.

22. The delta-sigma modulator of claim 21, further comprising an amplifier connected between at least one capacitor of the first SAR ADC stage and the input of the second SAR ADC stage, wherein the DAC is configured to convert a least significant bit (LSB) of the first digital signal to an analog signal applied to the input of the comparator.

23. The delta-sigma modulator of claim 21, further comprising a sample-and-hold circuit connected between the node and an input of the second SAR ADC stage, wherein the DAC is configured to convert the first digital signal to an analog signal applied to the input of the comparator.

24. The delta-sigma modulator of claim 23, further comprising:
 a first excess loop delay (ELD) digital-to-analog converter (DAC) having an input connected with an output of the second SAR ADC stage and an output connected with an input of a comparator in the first SAR ADC stage; and
 a second ELD DAC having an input connected with the output of the second SAR ADC stage and an output connected with an input of the sample-and-hold circuit.

25. The delta-sigma modulator of claim 24, further comprising an amplifier having an input connected with the at least one capacitor in the second SAR ADC stage, wherein:
 the loop comprises a first loop portion and a second loop portion;
 an output of the first loop portion is connected with a first input of a summer;
 an output of the amplifier is connected with a second input of the summer; and
 an output of the summer is connected with an input of the second loop portion.

26. The delta-sigma modulator of claim 25, further comprising a filter connected between the output of the amplifier and the second input of the summer.

27. A method of sampling an input signal, comprising:
 subtracting a feedback signal of a loop in a delta-sigma modulator from the input signal to generate a difference signal;
 processing the difference signal in a portion of the loop to generate a processed signal;
 sampling the processed signal with a quantizer to generate first and second digital signals, the sampling comprising:
  converting at least a portion of the processed signal to the first digital signal via a first successive approximation register (SAR) analog-to-digital converter (ADC) stage; and
  generating the second digital signal based on at least a portion of the first digital signal via a second SAR ADC stage connected with an output of the first SAR ADC stage; and
 generating the feedback signal of the loop based on the first and second digital signals.

28. The method of claim 27, wherein the sampling comprises:
 sampling the processed signal in the first SAR ADC stage during a first phase;
 converting the sampled processed signal to the first digital signal during a second phase;
 buffering the sampled processed signal to generate a buffered signal;
 sampling the buffered signal in the second SAR ADC stage during the second phase; and
 converting the sampled buffered signal to the second digital signal based on the at least the portion of the first digital signal during the first phase.

29. The method of claim 27, wherein the sampling comprises:
 sampling the processed signal in the first SAR ADC stage during a first phase;
 converting the sampled processed signal to the first digital signal during a second phase;
 sampling and holding the processed signal in a sample-and-hold circuit during the first phase to generate a held signal;
 sampling the held signal in the second SAR ADC stage during the second phase; and
 converting the sampled held signal to the second digital signal based on the at least the portion of the first digital signal during the first phase.

30. The method of claim 27, further comprising:
 buffering a residue of the second SAR ADC stage;
 processing the buffered residue; and
 feeding the processed, buffered residue back to a node in the portion of the loop.

* * * * *